(12) United States Patent
Strobl

(10) Patent No.: US 9,110,481 B2
(45) Date of Patent: Aug. 18, 2015

(54) METHOD AND ARRANGEMENT FOR FEEDING ELECTRICAL POWER FROM A WIND ENERGY INSTALLATION INTO AN AC VOLTAGE SYSTEM

(75) Inventor: Bernhard Strobl, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/345,288

(22) PCT Filed: Sep. 15, 2011

(86) PCT No.: PCT/EP2011/065998
§ 371 (c)(1),
(2), (4) Date: Mar. 17, 2014

(87) PCT Pub. No.: WO2013/037412
PCT Pub. Date: Mar. 21, 2013

(65) Prior Publication Data
US 2014/0347020 A1 Nov. 27, 2014

(51) Int. Cl.
*F03D 7/04* (2006.01)
*G05F 3/04* (2006.01)
(Continued)

(52) U.S. Cl.
CPC ............... *G05F 3/04* (2013.01); *F03D 7/0284* (2013.01); *F03D 7/048* (2013.01); *F03D 9/003* (2013.01); *F03D 9/005* (2013.01); *G01R 21/003* (2013.01);
(Continued)

(58) Field of Classification Search
CPC ....... Y02E 10/70; Y02E 10/76; Y02E 10/763; Y02E 40/00; Y02E 40/30; Y02E 40/34; Y02E 40/70; Y02E 40/74; F03D 9/003; H02J 3/18; H02J 3/1892; G01R 21/003; G05F 3/04; G05F 1/70; H02P 23/0081; H02M 1/42; H02M 1/4208
USPC ............... 323/205; 307/151, 153; 322/20, 37; 290/43, 44, 54, 55
See application file for complete search history.

(56) References Cited

U.S. PATENT DOCUMENTS 7,224,081 B2 5/2007 Larsen
7,606,638 B2 10/2009 Fortmann et al.
(Continued)

FOREIGN PATENT DOCUMENTS

DE 102004048341 A1 4/2006
EP 1512869 A1 3/2005

*Primary Examiner* — Adolf Berhane
*Assistant Examiner* — Jye-June Lee
(74) *Attorney, Agent, or Firm* — Laurence A. Greenberg; Werner H. Stemer; Ralph E. Locher

(57) ABSTRACT

Electrical power is fed from a wind energy installation into an AC voltage system via an energy transmission path, which is delimited by an installation-side transformer and a system-side transformer. A power factor correction device is connected, at a common node between the energy transmission path and the AC voltage system using a closed-loop control device, which controls the wind energy installation and which receives a variable which is proportional to the reactive power on the energy transmission path and a further measured variable. A measurement signal produced at the output of the power factor correction device is used as further measured variable. The closed-loop controller has such a control characteristic that the voltage on the low-voltage side of the system-side transformer increases, depending on the reactive power on the energy transmission path, from the inductive range to the capacitive range.

6 Claims, 4 Drawing Sheets

(51) Int. Cl.
*F03D 7/02* (2006.01)
*F03D 9/00* (2006.01)
*H02J 3/18* (2006.01)
*H02J 3/38* (2006.01)
*G01R 21/00* (2006.01)

(52) U.S. Cl.
CPC . *H02J 3/18* (2013.01); *H02J 3/386* (2013.01); *Y02E 10/723* (2013.01); *Y02E 10/763* (2013.01); *Y02E 40/30* (2013.01)

(56) References Cited

U.S. PATENT DOCUMENTS

| | | |
|---|---|---|
| 2008/0265577 A1 | 10/2008 | Fortmann et al. |
| 2009/0218817 A1 | 9/2009 | Cardinal et al. |
| 2011/0031762 A1* | 2/2011 | Letas ............... 290/55 |
| 2012/0306204 A1* | 12/2012 | Garcia ............ 290/44 |

* cited by examiner

METHOD AND ARRANGEMENT FOR FEEDING ELECTRICAL POWER FROM A WIND ENERGY INSTALLATION INTO AN AC VOLTAGE SYSTEM

BACKGROUND OF THE INVENTION

Field of the Invention

It is known to obtain electrical power by means of a wind energy installation and to feed this power via an energy transmission path into an AC voltage energy supply system. The wind energy installation may be a single wind generator or several wind generators which then form a so-called wind farm. The power transfer to the AC voltage system is performed at a point of common coupling, also referred to as point of common coupling (PCC).

In order to feed electrical power into a coupling point, requirements are set by the respective operator of the AC voltage system in respect of the quality of the electrical power fed in, and these requirements need to be adhered to by the wind energy installation. These include, inter alia, the fact that reactive power needs to be supplied by the wind energy installation to the coupling point. The supply can in this case take place at the coupling point in a feed or absorption of reactive power, depending on the situation.

Until now these requirements have been met by means of power factor correction installations which have connectable inductances and capacitances and are very complex.

Use is obviously also made of a method and an arrangement for feeding electrical power from a wind energy installation into an AC voltage system, as is apparent from FIG. 1. This figure shows schematically a wind energy installation 2 comprising a plurality of wind turbines 1, which wind energy installation is arranged at sea, for example. The wind energy installation 2 is connected to an AC voltage system 5 at a point of common coupling 4 via an energy transmission path 3. The energy transmission path 3 is in this case limited on one side by an installation-side transformer 6 and on the other side by a system-side three-winding transformer 7; a cable 8 which is connected to a busbar 8a is positioned between the two transformers.

As also shown in FIG. 1, the known arrangement is provided with a closed-loop control device 9 for the wind energy installation 1, which closed-loop control device ensures that the reactive power Q output in each case at the point of common coupling 4 meets the respective requirements made by the operator of the AC voltage system 5. In the known arrangement, an SVC power factor correction device 10 (SVC=static VAR compensator) which comprises an SVC control device 11 also contributes to this. On the output side, the SVC control device 11 is connected to the SVC power factor correction device 10.

The closed-loop control device 9 is connected at an input 12 to a measuring device 13 for detecting a measured variable M1 which is proportional to the reactive power on the energy transmission path 8; a further input 14 of the closed-loop control device 9 is connected to a measured value detection device 15 in the form of a voltage transformer in order to obtain a further measured variable M2, which is proportional to the voltage on the busbar 8a.

In the known arrangement, the reactive power Q can be subjected to closed-loop control at the point of common coupling 4 such that said reactive power meets the respective system requirements. In this case, the wind energy installation 1 absorbs reactive power Q1 in the case of a voltage U on the low-voltage side of the system-side transformer 7 which is above a reference value Uref (cf. FIG. 2) (inductive range ind of the characteristic K1 according to FIG. 2); in the case of a voltage U which is below the reference value Uref, the reactive power Q1 is fed in (capacitive range cap of the characteristic K1). The characteristic K1 shown in FIG. 2 shows that the voltage U on the low-voltage side of the system-side transformer 7 falls from the inductive range ind to the capacitive range cap.

BRIEF SUMMARY OF THE INVENTION

The invention is based on the object of proposing, on the basis of the method implemented in the known arrangement, a method with which an arrangement for feeding electrical power from a wind energy installation into an AC voltage system can be operated particularly inexpensively.

This object is achieved by a method for operating an arrangement for feeding electrical power from a wind energy installation into an AC voltage system via an energy transmission path, which is limited on one side by an installation-side transformer and on the other side by a system-side transformer with a connected power factor correction device, at a point of common coupling between the energy transmission path and the AC voltage system using a closed-loop control device controlling the wind energy installation, to which closed-loop control device a variable which is proportional to the reactive power on the energy transmission path and a further measured variable are applied on the input side, in which, according to the invention, a measurement signal obtained at the output of the power factor correction device is used as the further measured variable, and a closed-loop control device with such a control characteristic that the voltage on the low-voltage side of the system-side transformer increases from the inductive range to the capacitive range depending on the reactive power on the energy transmission path is used as the closed-loop control device.

An essential advantage of the method according to the invention in comparison with the known method consists in that, by virtue of taking into consideration a measurement signal obtained from the output variable of the power factor correction device during continuous operation, a correlation between the fed reactive power at the point of common coupling and the measurement signal is provided; a disruptive influence by a tap changer which is conventionally provided for tapping the system-side transformer is thus avoided.

The dynamic response is also improved because, in the method according to the invention, the wind energy installation and the power factor correction device do not operate in opposition to one another. That is to say that if, in the known method, for example, the power factor correction device feeds reactive power, then the voltage on the low-voltage side of the system-side transformer can increase or decrease there depending on the short-circuit impedance of this transformer. If a feed of reactive power results in an increase in the voltage, the wind energy installation absorbs a certain portion of the reactive power; the wind energy installation thus operates in opposition to the power factor correction device. Therefore, the known arrangement can only operate in voltage-controlled fashion when the power factor correction device has a relatively large design. In comparison with this, the method according to the invention manages with a comparatively small power factor correction device.

The present invention is based on the concept of using the output variable of the power factor correction device for the closed-loop control, although the influence of the wind energy installation on this variable is very low. The output variable can, however, be used as an indication of whether the power factor correction device is feeding reactive power into the AC voltage system or absorbing reactive power. In the case of a feed, the output variable is higher than in the case of absorption, for which reason this variable can be used as further measured variable or measurement signal for the closed-loop control device.

In the method according to the invention, the measurement signal can be obtained in a variety of ways. It is considered to be particularly advantageous if the measurement signal is obtained from the voltage at the output of the power factor correction device.

It may also be advantageous, however, to obtain the measurement signal from the reactive power at the output of the power factor correction device.

The invention also relates to an arrangement for feeding electrical power from a wind energy installation into an AC voltage system via an energy transmission path, which is limited on one side by an installation-side transformer and on the other side by a system-side transformer with a connected power factor correction device, at a point of common coupling between the energy transmission path and the AC voltage system with a closed-loop control device for the wind energy installation, wherein a variable which is proportional to the reactive power on the energy transmission path is applied to the closed-loop control device at one input and a further measured variable is applied to the closed-loop control device at a further input; such an arrangement is illustrated as prior art in FIG. 1.

In order to be able to produce such an arrangement at comparatively low cost, according to the invention, the further input of the closed-loop control device is connected to a measured value detection device, which is connected to the output of the power factor correction device, and the closed-loop control device has such a control characteristic that the voltage on the low-voltage side of the system-side transformer increases from the inductive range to the capacitive range depending on the reactive power on the energy transmission path.

Such an arrangement with an embodiment according to the invention has the same advantages as those already mentioned above in connection with the embodiments for the method according to the invention.

The measured value detection device can have different configurations in the arrangement according to the invention. It appears to be particularly advantageous if the measured value detection device is a voltage transformer or a reactive power measuring device.

For the further explanation of the invention,

DESCRIPTION OF THE INVENTION

Figure 1:
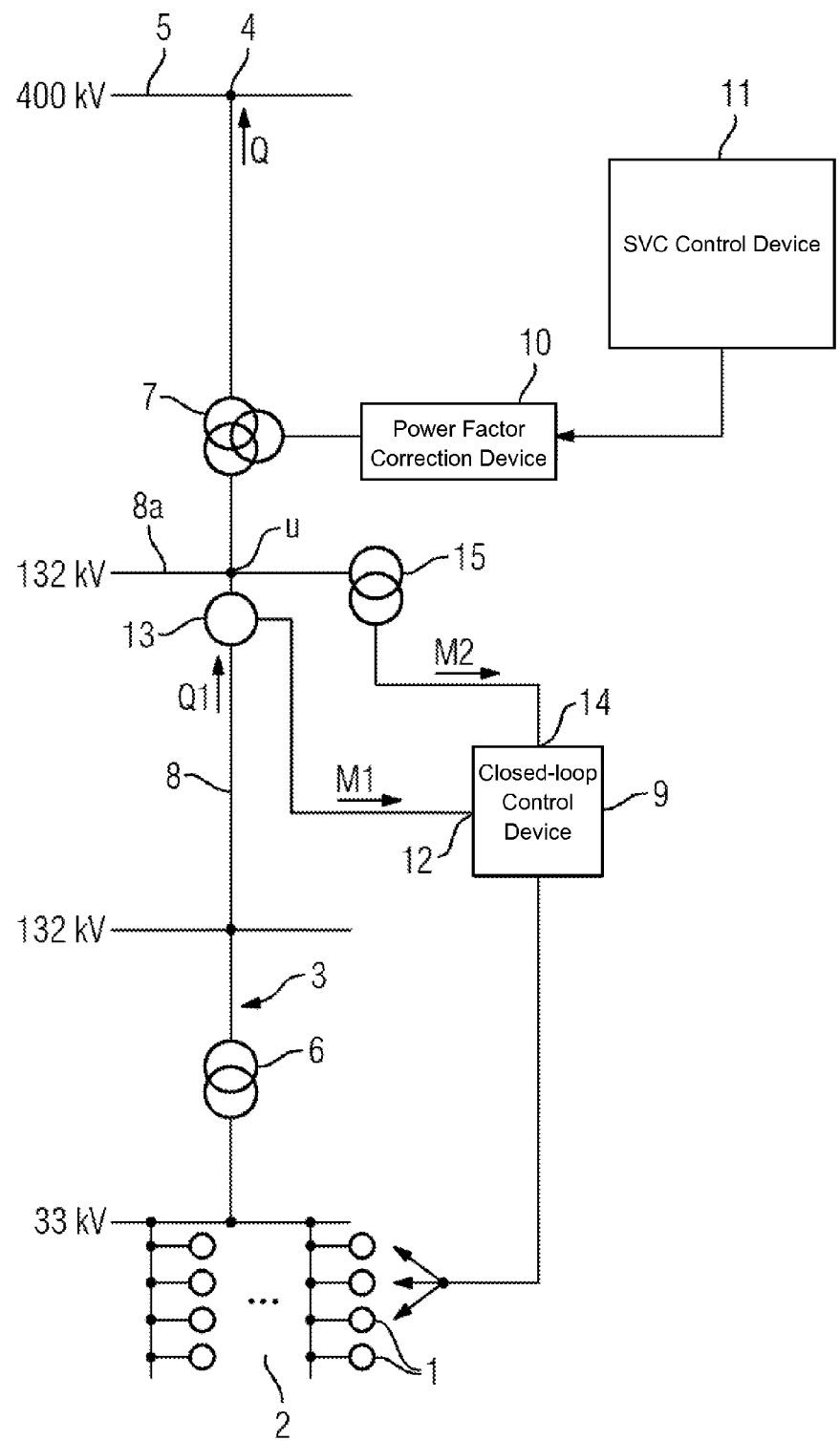
FIG. 1 shows an arrangement according to the prior art.
Figure 3:
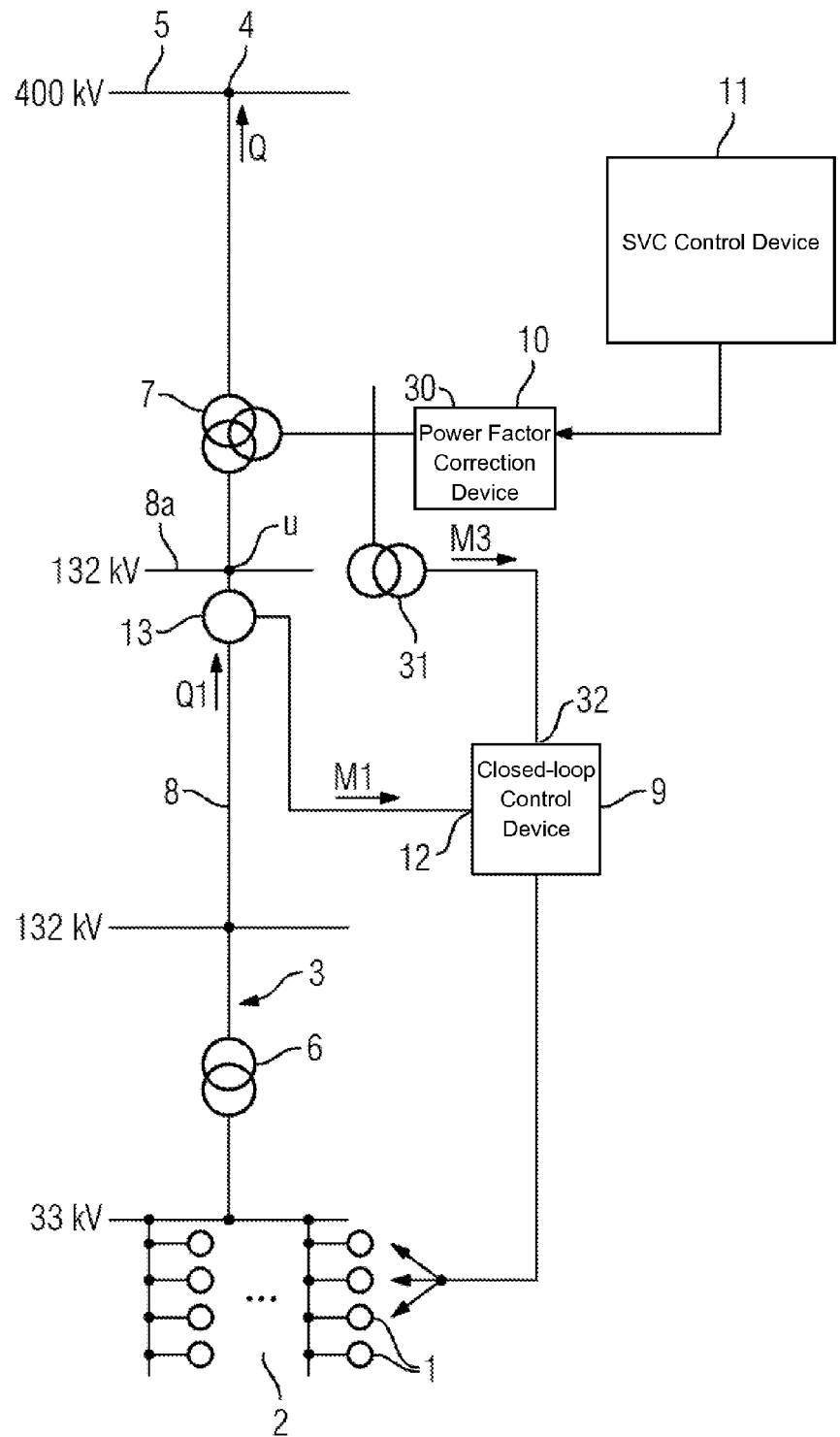
FIG. 3 shows an exemplary embodiment of the arrangement according to the invention.

The arrangement shown in FIG. 3 has been provided with the same reference symbols in respect of its elements corresponding to the arrangement shown in FIG. 1.

The arrangement shown in FIG. 3 differs from the arrangement shown in FIG. 1 in that a measured value detection device in the form of a voltage transformer 31 is connected on the primary side to the output 30 of the power factor correction device 10. This voltage transformer 31 is connected on the secondary side to an input 32 of the closed-loop control device 9 and outputs a measurement signal M3 to the closed-loop control device 9.

The measurement signal M3 is therefore proportional to the voltage at the output of the power factor correction device 10. This voltage is used as an indication of whether the power factor correction device 10 is feeding reactive power into the AC voltage system or absorbing reactive power at that time. If at that time a feed is taking place, the voltage at the output 30 of the power factor correction device 10 is greater than in the case of absorption. Therefore, the measurement signal M3 is suitable as the input signal for the closed-loop control device 9.

Figure 2:
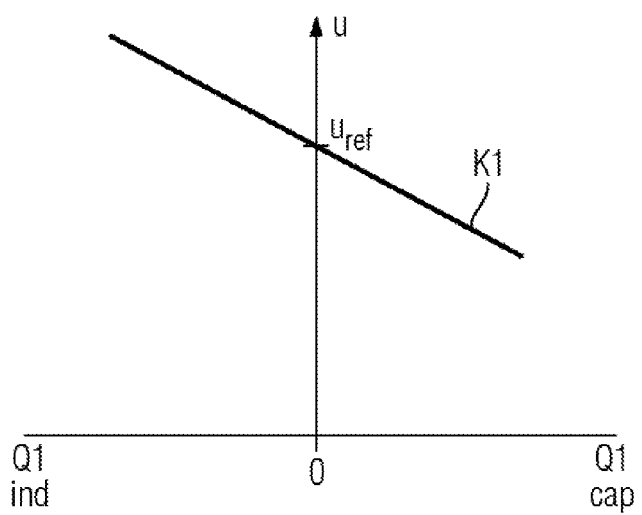
FIG. 2 shows a control characteristic of the arrangement according to the prior art.
Figure 4:
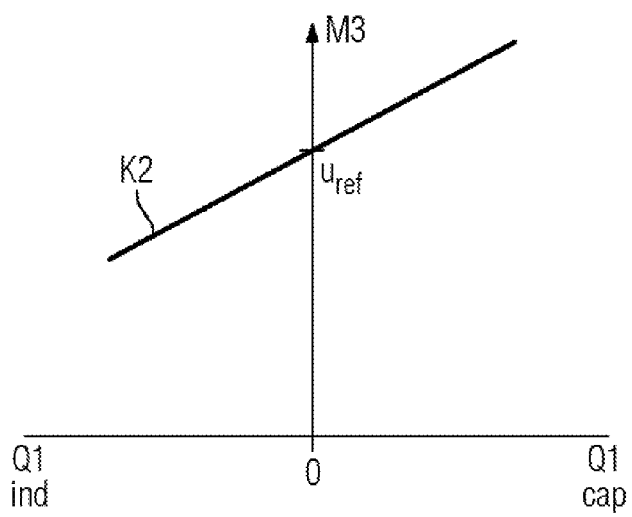
FIG. 4 shows a control characteristic used in the arrangement according to the invention.

As shown in FIG. 4, a closed-loop control device 9 is used in the arrangement shown in FIG. 4, said closed-loop control device resulting in an inverse characteristic K2 in comparison with the characteristic shown in FIG. 2 over the reactive power K1 on the energy transmission path 8. In the characteristic K2, the measurement signal M3 increases from the inductive range ind to the capacitive range cap.

Overall, the method according to the invention and the arrangement according to the invention make it possible to achieve a situation whereby the wind energy installation 2 supports the power factor correction device 10 both during feeding and during absorbing of reactive power. That is to say if the power factor correction device 10 is feeding reactive power, then the voltage at its output 30 is relatively high, which results in an additional feed of reactive power on the part of the wind energy installation 2 in accordance with the characteristic K2 shown in FIG. 4. The same applies in the case of absorption of reactive power. The wind energy installation 2 therefore supports in each case the operation of the power factor correction device 10, for which reason the power factor correction device 10 can be comparatively small.

The invention claimed is:

1. A method of operating a system for feeding electrical power from a wind energy installation into an AC voltage system via an energy transmission path, which is delimited on one side by an installation-side transformer and on another side by a system-side transformer with a power factor correction device connected thereto, at a common node between the energy transmission path and the AC voltage system, the method comprising:
    determining a variable that is proportional to a reactive power on the energy transmission path;
    obtaining a measurement signal at an output of the power factor correction device as a further measured variable;
    providing a closed-loop control device for controlling the wind energy installation and inputting to the closed-loop control device the variable that is proportional to the reactive power on the energy transmission path and the further measured variable; and
    operating the closed-loop control device with a control characteristic such that a voltage on a low-voltage side of the system-side transformer increases from an inductive range to a capacitive range depending on the reactive power on the energy transmission path.

2. The method according to claim 1, which comprises obtaining the measurement signal from the voltage at the output of the power factor correction device.

3. The method according to claim 1, which comprises obtaining the measurement signal from the reactive power at the output of the power factor correction device.

4. A configuration for feeding electrical power from a wind energy installation into an AC voltage system, comprising:
- an energy transmission path connected between the wind energy installation and the AC voltage system at a node between said energy transmission path and the AC voltage system, said energy transmission path being delimited by an installation-side transformer and a system-side transformer;
- a power factor correction device having an output, said power factor correction device being connected to said system-side transformer;
- a closed-loop control device for the wind energy installation, said closed-loop control device having a first input connected to receive a variable that is proportional to a reactive power on said energy transmission path, an a second input;
- a measured value detection device connected to said output of said power factor correction device and to said second input of said closed-loop control device; and
- said closed-loop control device having such a control characteristic that a voltage on a low-voltage side of said system-side transformer increases from an inductive range to a capacitive range depending on the reactive power on said energy transmission path.

5. The configuration according to claim 4, wherein said measured value detection device is a voltage transformer.

6. The configuration according to claim 4, wherein said measured value detection device is a reactive power measuring device.

* * * * *